United States Patent [19]

Takahashi et al.

[11] Patent Number: 4,617,469
[45] Date of Patent: Oct. 14, 1986

[54] EXPOSURE APPARATUS WITH DETECTING MEANS INSERTABLE INTO AN EXPOSURE PATH

[75] Inventors: Kazuo Takahashi, Kawasaki; Hiroshi Sato, Tokyo; Masao Kosugi, Yokohama, all of Japan

[73] Assignee: Canon Kabushiki Kaisha, Tokyo, Japan

[21] Appl. No.: 552,313

[22] Filed: Nov. 16, 1983

[30] Foreign Application Priority Data

Nov. 26, 1982 [JP] Japan ............................. 57-207207

[51] Int. Cl.⁴ .......................................... G01N 21/86
[52] U.S. Cl. .................................... 250/548; 250/557
[58] Field of Search ............... 250/548, 557; 356/399, 356/400, 401, 141, 152

[56] References Cited

U.S. PATENT DOCUMENTS

| | | | |
|---|---|---|---|
| 4,052,603 | 10/1977 | Karlson | 356/400 |
| 4,167,677 | 9/1979 | Suzki | 356/401 |
| 4,251,160 | 2/1981 | Bouwhuis et al. | 356/401 |
| 4,269,505 | 5/1981 | Mayer | 250/548 |
| 4,362,389 | 12/1982 | Koizumi | 356/401 |
| 4,492,459 | 1/1985 | Omata | 356/401 |

Primary Examiner—David C. Nelms
Attorney, Agent, or Firm—Fitzpatrick, Cella, Harper & Scinto

[57] ABSTRACT

An exposure apparatus for aligning an original, having at least one alignment mark thereon, and radiation sensitive member, having at least one alignment mark thereon and adapted to receive the image of the original, with each other includes a first detecting device including a sensor retractable from the optical path of a light for illuminating the original, the sensor being adapted to sense the original and radiation sensitive member to detect a relative displacement (degree of misalignment) between the original and radiation sensitive member when the sensor is in the optical path; a second detecting device including a sensor set out of the optical path and adapted to detect the position of one of the original and radiation sensitive member in the absolute coordinates of the apparatus; and a driving mechanism for moving one of the original and radiation sensitive member in response to the output of the second detecting device to correct the above mentioned displacement.

19 Claims, 4 Drawing Figures

EXPOSURE APPARATUS WITH DETECTING MEANS INSERTABLE INTO AN EXPOSURE PATH

BACKGROUND OF THE INVENTION

1. Field of the Invention

The present invention relates to an exposure apparatus, and more particularly, a die-by-die, or shot by shot exposure apparatus for manufacturing semiconductor circuits, and provides an apparatus which can reduce time required in the operational step from the alignment to the exposure at each shot.

2. Description of the Prior Art

There is generally known semiconductor manufacturing exposure systems in which the pattern on a mask or reticle (hereinafter called generally a "mask") as an original is printed on a wafer. Recently, more attention has been attracted to an die-by-die type exposure system (a so-called stepper).

In such a stepper, the pattern on a mask is projected and printed on a wafer at a reduced scale through a projection optical system having its magnification less than unit. To avoid any overlapping in the exposed areas at each shot, the mask and wafer are moved relative to each other so that the pattern will be printed on all the effective areas of the wafer through a plurality of shots.

With the die-by-die exposure utilizing the above projection at the reduced scale, the pattern on the mask can be made larger than the pattern to be printed on the wafer by a factor of the inverse number of the magnification in an imaging system. Thus, difficulties in manufacturing marks can be eased so that finer patterns can be printed on wafers.

The stepper is generally classified into two types, that is, (1) the OFF-AXIS alignment type and (2) the TTL (Through The Lens) ON-AXIS alignment type.

In the off-axis alignment system, the pattern on a wafer is aligned with an alignment optical system located out of a projection optical system without passing through the latter. Thereafter, the wafer is accurately moved below the projection optical system such that the wafer pattern will be aligned indirectly with the pattern on a photo-mask.

In the TTL on-axis alignment system, the patterns on a photo-mask and wafer are simultaneously observed to align them directly with each other. The stepper should have a precision of alignment on the order of 0.1 to 0.2 μm. The off-axis alignment system has a larger number of factors of error, because of the fact that the wafer pattern is aligned indirectly with the photo-mask pattern and also cannot deal with inplane-distortion in the wafer. To improve the precision of alignment, therefore, it is highly desirable to develop the TTL on-axis alignment system.

The prior art TTL on-axis alignment type steppers utilize the following alignment process:

(1) Displacement, i.e., the misalignment between a mask and wafer is measured through a binocular microscope which is positioned in an optical path of illumination. For example, as disclosed in U.S. Pat. No. 4,167,677, alignment marks of a particular shape on the mask and wafer are scanned by a laser beam such that the degree of misalignment can automatically be measured in an photoelectric manner.

(2) The degree of misalignment measured in the above step (1) is corrected by moving a stage on which the mask or wafer is placed.

(3) Whether or not the correction is properly made is verified by the use of the binocular microscope which is located in the optical path of illumination.

(4) The binocular microscope is retracted out of the optical path.

However, the TTL on-axis alignment system has a problem in that longer time is required in the operation from the beginning of the alignment to the exposure at each shot.

Further, during the entire exposure step, two alignment marks to be observed through the binocular microscope at each shot should be maintained at such a state that the alignment marks can be used. In addition, if the alignment mark on the outer margin of the exposed region on the wafer is partially broken, no alignment operation can be made.

SUMMARY OF THE INVENTION

It is a principal object of the present invention to provide an exposure apparatus which can be operated at higher speed.

Another object of the present invention is to provide an apparatus for detecting misalignment between an original and a radiation sensitive member when they are overlapped one above another, which apparatus requires a reduced time from the beginning of the detection of misalignment to the end of the exposure.

Still another object of the present invention is to provide an apparatus wherein a binocular microscope for detecting the radiation sensitive member through the original, is retracted out of the optical path after it has been verified by the binocular microscope that the misalignment was corrected.

A further object of the present invention is to provide an alignment-scope which can be operated for alignment in a binocular or ocellar mode.

In the preferred embodiment of the present invention which is constructed to accomplish the above objects, one of two binocular microscopes for alignment is positioned in an optical path of illumination and the other is located out of the optical path. The one microscope is used to detect a misalignment between the mask and wafer. Based on the detected misalignment, the mask or wafer is moved relative to the other to correct the misalignment while at the same time this microscope is retracted out of the optical path. At this time, the change in the absolute position of the mask is verified by the other microscope.

These and other objects, features and advantages of the present invention will become more apparent upon a consideration of the following description of the preferred embodiment of the present invention taken in conjunction with the accompanying drawings.

DESCRIPTION OF THE PREFERRED EMBODIMENT

Figure 1:
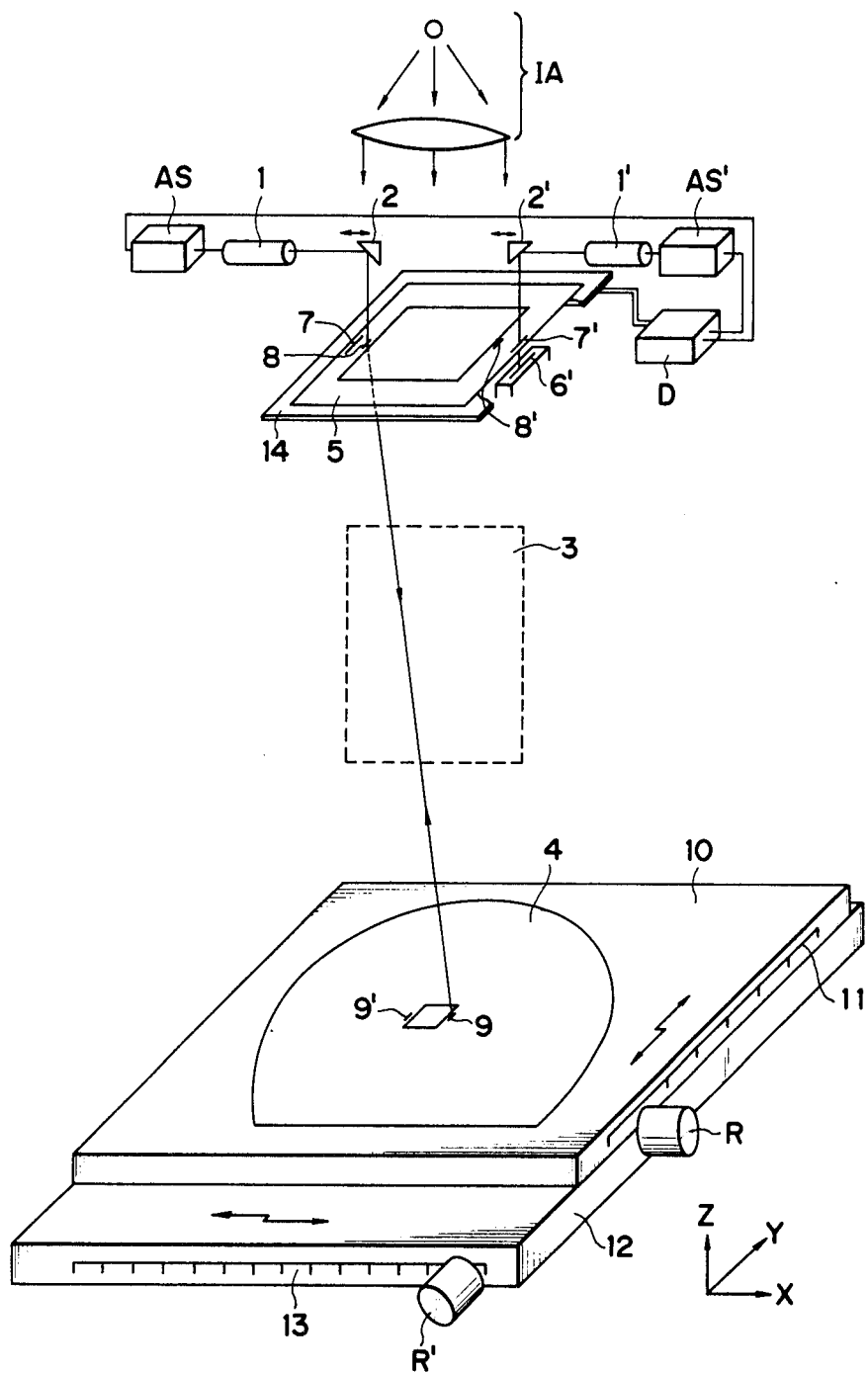
FIG. 1 is a view of one embodiment according to the present invention.

Referring to FIG. 1, the apparatus according to the present invention comprises two microscopes (alignment-scopes) each including an objective lens 1 or 1' and an reflection mirror or prism 2 or 2'. Each of the alignment-scopes further includes a main body AS or AS' which contains a source of light, a optical scanning device, a light receiving device, a viewer and others. The alignment-scopes will not be further described for the sake of simplicity of explanation since they are described in detail in the above U.S. Pat. No. 4,167,677.

The apparatus also comprises a reduction-projection optical system 3 which serves to place a wafer 4 which has a radiation sensitive (such as photosensitive) surface and a mask 5 in optical conjugation with each other. An illumination system IA is located above the mask 5 to illuminate the region of a circuit pattern thereon. The frame of the apparatus includes mask reference marks 6' and 6 (the latter is not shown) used to detect the absolute position of the mask and alignment marks 7 and 7' on the mask which are used to detect the position of the mask relative to the mask reference marks 6 and 6'. The marks 6, 7 and 6', 7' are respectively coarsely aligned by the use of the respective alignment-scopes AS and AS'. This will be referred to as "the preset of the mask". The mask 5 further includes alignment marks 8 and 8' near the circuit pattern thereof which are used to align the mask and wafer with each other. The wafer 4 has alignment marks 9 and 9' thereon. Although FIG. 1 shows only a pair of alignment marks 9 and 9', the actual number of such alignment marks is equal to that of shots performed in this apparatus.

The apparatus further comprises a Y-stage 10 for moving the wafer in the Y-direction, a high-precision scale 11 mounted on the Y-stage 10, an X-stage 12 for moving the wafer in the X-direction, a high-precision scale 13 mounted on the X-stage and scale readers R and R' fixed to the frame of the apparatus (not shown). The stages 10 and 12 are used to step the wafer 4. The apparatus further comprises a mask stage 14 for moving the mask 5 with fine motions in the X- and Y-directions. The mask stage 14 includes an opening (not shown) through which the image of the mask 5 passes. The mask stage 14 is driven by a drive D in the X- and Y-directions until a misalignment detected by the alignment-scope AS becomes equal to a measurement in the alignment-scope AS40.

The mask alignment mark 8 and wafer alignment mark 9', which are to be observed through the objective lens 1 in the alignment-scope, are located in the illumination optical path of exposure. On the other hand, the mask reference mark 6' and mask alignment mark 7', which are to be observed through the objective lens 1' in the alignment-scope, are located out of the above optical path.

Figure 2:
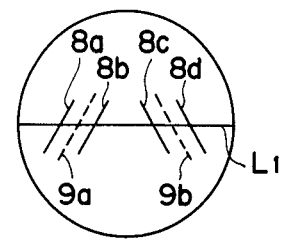
FIG. 2 is a view showing the field of view in a microscope in an optical path of exposure.
Figure 3:
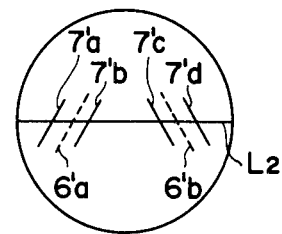
FIG. 3 is a view showing the field of view in another microscope out of the optical path.

The fields of view observed through the objective lenses 1 and 1' are shown in FIGS. 2 and 3, respectively.

Referring to FIG. 2, the mask alignment mark 8 consists of two sets of parallel lines 8a, 8b and 8c, 8d, these sets being inclined oppositely relative to each other. The wafer alignment mark 9' consists of two lines 9a and 9b each of which is observed to positioned between the parallel lines of the corresponding set in the mask alignment mark 8.

Referring to FIG. 3, the mask alignment mark 7' consists of two sets of parallel lines 7'a, 7'b and 7'c, 7'd while the mask reference mark 6' consists of two lines 6'a and 6'b. These lines are arranged in the same manner as those of FIG. 2.

The lines of the marks are scanned respectively by scanning laser beams L1 and L2 to photoelectrically detect the degree of misalignment in the following manner:

If there is a relative misalignment between the mask and wafer, the spacing between the mark lines 8a and 9a becomes non-equal to that between the mark lines 9a and 8b. Simultaneously, the spacing between the mark lines 8c and 9b becomes non-equal to that between the mark lines 9b and 8d. This is utilized to detect the degrees of misalignment between the mask and wafer both in the X- and Y-directions. If the relative misalignment Δ between the mask 5 and the wafer 4 is detected through the objective lens 1 in the alignment-scope AS, the mask stage 14 is moved with fine motion in the X- and Y-directions to correct this misalignment Δ. At this time, any change in the relative position between the mask 5 and the wafer 4 is verified through the objective lens 1' of the alignment-scope AS' located out of the illumination optical path. If the mask stage 14 is moved by a distance -A to correct the misalignment Δ between the mask 5 and the wafer 4, it can be verified depending on whether or not the spacings between the mark lines 7'a, 6'a; 6'a, 7'b; 7'c, 6'b and 6'b, 7'd become coincident with the distance −Δ, as shown in FIG. 3.

At the same time as the mask stage 14 is moved, the reflection prism 2 or the objective lens 1 and reflection prism 2 in the alignment-scope AS are retracted out of the illumination optical path. Thus, when the correction of the relative misalignment between the mask and wafer is verified through the objective lens 1' in the alignment-scope AS', the reflection prism 2 has already be retracted out of the illumination optical path. The procedure can immediately be advanced to the exposure step without any stand-by time as in the prior art. Thus, time required in the operation from the alignment to the exposure at each shot can be reduced to improve the throughput.

Although the objective lens 1' in the alignment-scope AS' may be stationary, it is preferred that it is movable since this alignment-scope AS' may be used as a microscope located within the illumination optical path as will be described below.

Namely, although FIG. 1 shows the left-hand microscope located within the illumination optical path and the right-hand microscope located out of the optical path, it is desirable that the right-hand microscope AS' is movable in the X- and Y-directions such that it can be located within the illumination optical path. Because of the movability, it is possible that the alignment for the first shot is performed with two microscopes AS and AS' both inserted in the illumination optical path, and then the alignments for the subsequent shots are performed in the manner of the present invention as described above, i.e., with the microscope 1' at the position shown in FIG. 1.

In the preferred embodiment of the present invention, the mask reference marks 6 and 6' are positioned close to the mask 5. However, the mark reference marks 6 and 6' may be provided integrally with the projection optical system 3, for example, on the mirror barrel of the projection optical system 3 at the top thereof to provide no relative offset between the mask reference marks and the projection optical system 3.

The positions of the mask reference marks 6 and 6' and the positions of the mask alignment marks 7 and 7' relative to the mask reference marks are not limited to those shown in FIG. 1.

The configuration of the alignment marks is not limited to that shown in the drawings as far as they can detect any misalignment in the X-direction or the Y-direction.

Although the illustrated embodiment has been described in which the misalignment between the mask and wafer is measured through one of the objective lenses, and the mask stage is moved for alignment while monitoring, with the other objective lens, the positional relationship between the mask alignment mark and the mask reference mark, the wafer stage instead of the mask stage may be moved with fine motion.

If the wafer stages has high-precision scales, it can be considered that after the relative misalignment between the mask and wafer has been measured through the microscope (ocellar or binocular microscope) within the illumination optical path, the wafer stages 10 and 12 are moved to correct the relative misalignment between the mask and wafer, relying upon the high-precision scales, by the amount read by the reader R and R' without any verification of the corrected positional misalignment through the microscopes. At the same time, the microscope is retracted out of the illumination optical path for exposure. If the relative misalignment is measured by the binocular microscope, the rotational misalignment between the mask and wafer can be corrected.

Each of the wafer stages may have a high-precision laser interferometer in place of the high-precision scale. If the wafer stages having high-precision scales are incorporated into the apparatus, the correction of alignment may be effected one through several shots. In place of that the alignment is carried out based on the TTL method at each shot, and, at the remaining shots, the wafer stage is stepped through a predetermined distance without alignment operation, relying on the precision of the scale, and then the wafer is exposed.

Figure 4:
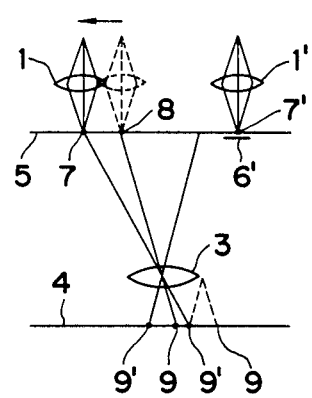
FIG. 4 is a view showing a modification with respect to the embodiment of the present invention shown in FIG. 1.

In addition, the binocular microscope may freely be positioned in the apparatus and particularly it may be retracted to any suitable position out of the illumination optical path. As shown in FIG. 4, therefore, the relative misalignment between the mask and wafer at a certain shot may be measured at a shot immediately before said one shot. In this case, at the same time as the termination of the exposure, the wafer may be stepped in consideration of the amount of correction thus determined beforehand.

It is apparent that if two microscopes are made movable, the alignment may be carried out within the illumination optical path in the binocular manner in the manner of the prior art. In the other case, the alignment may be effected within the illumination optical path in the ocellar manner in accordance with the present invention.

In summary:

(1) Displacement between the mask and wafer is measured through the ocellar alignment microscope located within the illumination optical path. At the same time, the absolute position of the mask is detected through the other ocellar microscope located out of the exposure optical path.

(2) The mask stage is moved depending on the detected displacement and at the same time the correction of this displacement is confirmed or verified through the ocellar alignment microscope located out of the exposure optical path. Simultaneously, the alignment microscope within the exposure optical path is retracted out of the exposure optical path. Thereafter, the exposure step is performed. Thus, the operational time from the alignment to the exposure can effectively be reduced.

The prior art utilized two sets of alignment marks at minimum at each shot. However, if only one set of alignment marks are effectively present on the wafer for any reason, no alignment can be made at that shot. In accordance with the present invention, the alignment can be made if only one set of alignment marks at minimum are present. Even though only one set of alignment marks on both the mask and wafer extend over the outer margin of the wafer, the alignment can be made according to the present invention. This is particularly effective if a plurality of chips are printed at a single shot.

As will be understood from the foregoing, the apparatus according to the present invention can perform its inherent function in which the advantage of the TTL alignment system is utilized to execute the alignment at each shot with binocular detection with higher precision, and in addition, can improve the productivity while maintaining the high-precision alignment, by effecting the TTL alignment at each shot with ocellar detection and combining the subsequent operations.

While the invention has been described with reference to the structures disclosed herein, it is not confined to the details set forth and this application is intended to cover such modifications or changes as may come within the purposes of the improvements or the scope of the following claims.

What is claimed is:

1. An alignment apparatus for aligning an original and a photosensitive member, said apparatus comprising:

means for exposing the photosensitive member to an image of the original through an exposure optical path extending between the original and the photosensitive member;

first detecting means mounted for insertion into and retraction from the exposure optical path, said first detecting means being capable of detecting positional deviation between the original and the photosensitive member when inserted in the exposure optical path;

second detecting means disposed out of the exposure optical path to detect a change in the position of at least one of the original and the photosensitive member and for producing an output representing said change in position; and means for correcting positional deviation between the original and the photosensitive member in accordance with the positional deviation detected by said first detecting means, said correcting means confirming the correction of the positional deviation on the basis of the output of said second detecting means.

2. An apparatus according to claim 1, wherein said exposure means projects images of the original on the photosensitive member.

3. An apparatus according to claim 2, wherein said exposure means includes an image projection optical system for projecting a plurality of the images of the originals onto the photosensitive member at a reduced magnification.

4. An apparatus according to claim 1, wherein said first detecting means is retracted from the exposure optical path when said correcting means corrects the positional deviation.

5. An apparatus according to any one of claims 1 to 4 wherein said correcting means corrects the positional deviation by moving the original.

6. An apparatus according to claim 1, wherein said second detecting means includes an observation optical system for observing a mark formed on the original and a mark formed on the apparatus.

7. An apparatus according to claim 6, wherein said first detecting means includes an observation optical system for observing a first mark formed on the original and a mark formed on the wafer, and said second detecting means includes an observation optical system for observing a second mark formed on the original and a mark formed on the apparatus.

8. An apparatus according to claim 6, wherein said second detecting means is mounted for insertion from a set position outside the exposure optical path into the exposure optical path.

9. An apparatus according to claim 1, wherein said correcting means corrects the positional deviation by moving the photosensitive member.

10. An apparatus according to claim 9, wherein said second detecting means includes at least one of a scale and a laser interferometer.

11. An alignment for aligning an original on a photosensitive member, said method comprising the steps of:
first detecting a positional deviation between the original and the photosensitive member with first detecting means disposed in an exposure optical path through which the photosensitive member is exposed to an image of the original and extending between the original and photosensitive member;
moving said first detecting means out of the exposure path after the positional deviation is detected;
second detecting a change in the position of at least one of the original and the photosensitive member with a second detecting means disposed out of the exposure path;
correcting for the deviation detected by said first detecting means by moving at least one of the original and the photosensitive member while confirming the position thereof with said second detecting step; and
exposing the photosensitive member to an image on the original through the exposure path after the positional deviation is corrected.

12. A method according to claim 11, further comprising the step of moving the photosensitive member relative to the original after completion of the exposure.

13. A method according to claim 12, wherein said exposing step comprises projecting the image of the original on the photosensitive member through the exposure path.

14. A method according to claim 11, wherein said moving step comprises retracting said first detecting means from the exposure path while the positional deviation is being corrected.

15. A method according to claim 11, wherein said first detecting step is performed by detecting a mark formed on the original and a mark formed on the photosensitive member.

16. A method according to any one of claims 11 to 15, wherein correcting step comprises moving the original.

17. A method according to claim 16, wherein said second detecting step is performed on the basis of a mark formed on the original and a mark formed on an apparatus for performing the alignment of said method.

18. A method according to claim 11, wherein said correcting step is preformed by moving the photosensitive member.

19. A method according to claim 18, wherein said second detecting step is preformed using at least one of a scale and a laser interferometer.

* * * * *

UNITED STATES PATENT AND TRADEMARK OFFICE
CERTIFICATE OF CORRECTION

PATENT NO. : 4,617,469
DATED : October 14, 1986
INVENTOR(S) : KAZUO TAKAHASHI, ET AL.

It is certified that error appears in the above-identified patent and that said Letters Patent is hereby corrected as shown below:

AT [57] IN THE ABSTRACT

Line 18, "above mentioned" should read --above-mentioned--.

COLUMN 1

Line 9, "shot by shot" should read --shot-by-shot--.
Line 20, "an" should read --a--.
Line 25, "than" should read --than a--.
Line 68, "an" should read --a--.

COLUMN 3

Line 9, "a" should read --an-- (second occurrence).
Line 49, "AS40" should read --AS'--.
Line 64, "to" should read --to be--.

COLUMN 4

Line 24, "-A" should read ---$\Delta$--.
Line 36, "be" should read --been--.
Line 39, "time" should read --the time--.
Line 63, "mark" should read --mask--.

UNITED STATES PATENT AND TRADEMARK OFFICE
CERTIFICATE OF CORRECTION

PATENT NO. : 4,617,469

DATED : October 14, 1986

INVENTOR(S) : KAZUO TAKAHASHI, ET AL.

It is certified that error appears in the above-identified patent and that said Letters Patent is hereby corrected as shown below:

COLUMN 6

Line 14, "are" should read --is--.

Signed and Sealed this

Nineteenth Day of July, 1988

Attest:

DONALD J. QUIGG

Attesting Officer      Commissioner of Patents and Trademarks